United States Patent
Inoue et al.

(10) Patent No.: US 12,188,891 B2
(45) Date of Patent: Jan. 7, 2025

(54) CHARGE AMOUNT MEASUREMENT METHOD AND CHARGE AMOUNT MEASUREMENT SYSTEM

(71) Applicant: TOYO Corporation, Tokyo (JP)

(72) Inventors: Masaru Inoue, Tokyo (JP); Noriaki Oyabu, Tokyo (JP)

(73) Assignee: TOYO CORPORATION, Tokyo (JP)

( * ) Notice: Subject to any disclaimer, the term of this patent is extended or adjusted under 35 U.S.C. 154(b) by 0 days.

(21) Appl. No.: 18/695,154

(22) PCT Filed: Sep. 27, 2021

(86) PCT No.: PCT/JP2021/035456
§ 371 (c)(1),
(2) Date: Mar. 25, 2024

(87) PCT Pub. No.: WO2023/047600
PCT Pub. Date: Mar. 30, 2023

(65) Prior Publication Data
US 2024/0328984 A1 Oct. 3, 2024

(51) Int. Cl.
*G01N 27/22* (2006.01)
(52) U.S. Cl.
CPC .................. *G01N 27/226* (2013.01)
(58) Field of Classification Search
USPC ............... 324/71.3, 71.4, 713–719
See application file for complete search history.

(56) References Cited

U.S. PATENT DOCUMENTS

| 5,284,956 A | 2/1994 | Buchecker et al. |
| 2004/0063018 A1* | 4/2004 | Silence ............... G03G 9/0823 430/108.4 |
| 2009/0267614 A1 | 10/2009 | Inoue et al. |
| 2017/0038614 A1* | 2/2017 | Zou ..................... G02F 1/0045 |

(Continued)

FOREIGN PATENT DOCUMENTS

| CN | 109031732 | 12/2018 |
| DE | 112018007181 | 12/2020 |
| JP | 2-117659 | 5/1990 |

(Continued)

OTHER PUBLICATIONS

Naemura, Shohei, "Measurement of a small amount of mobile ions in liquid crystals," Applied Physics, Oct. 10, 1996, vol. 65, No. 10, pp. 1065-1066, with partial English translation.

(Continued)

*Primary Examiner* — Vincent Q Nguyen
(74) *Attorney, Agent, or Firm* — Wenderoth, Lind & Ponack, L.L.P.

(57) ABSTRACT

A charge amount measurement method includes applying a periodically-changing voltage between a pair of electrodes arranged with a sample interposed therebetween in a cell in which the sample is encapsulated, the sample being created by mixing a material to be measured with a nonpolar liquid crystal whose liquid crystal molecules do not rotate due to an application of the periodically-changing voltage; and measuring an amount of charge in the material to be measured, based on a current that flows through the pair of the electrodes and the sample due to the application of the periodically-changing voltage.

6 Claims, 8 Drawing Sheets

(56) References Cited

U.S. PATENT DOCUMENTS

2019/0064242 A1 2/2019 Hasebe et al.
2020/0348253 A1 11/2020 Inoue et al.

FOREIGN PATENT DOCUMENTS

| JP | 11-95205 | 4/1999 |
|----|----------|--------|
| JP | 2006-243638 | 9/2006 |
| JP | 2009-138023 | 6/2009 |
| JP | 2009-155416 | 7/2009 |
| JP | 5348751 | 11/2013 |
| JP | 2019-45185 | 3/2019 |
| JP | 2020-8586 | 1/2020 |
| WO | 2008/090786 | 7/2008 |

OTHER PUBLICATIONS

International Search Report issued Dec. 7, 2021 in International (PCT) Application No. PCT/JP2021/035456, with its English translation.
Inoue, Masaru et al., "Correlation between ion impurity in thermally activated delayed fluorescence organic light-emitting diode materials and device lifetime", J. Soc. Inf. Display, vol. 28, Issue 11, 2020, pp. 905-910.
Iwabata, Kazuki et al., "Ion Density Analysis of Single-Stranded DNA in Liquid Crystal," Jpn. J. Appl. Phys., 52, 2013, pp. 097301-1 through 097301-5.
Inoue, Masaru et al., "Mobile ion frequency dependency in LCD cells and correlation between mobile ion and voltage holding ratio," Japan Liquid Crystal Society, 2019, pp. 362-363, with its partial English translation of the section "2.2.2 Correlation among VHR, ion impurity amount, and cell resistance" on p. 7 from "Review of various measurement methodologies of migration ion influence on LCD image quality and new measurement proposal beyond LCD materials".
Inoue, Masaru et al., "Novel measurement method of ion impurity in OPV materials," P-L4, AM-FPD, 2019, pp. 1-2.
Inoue, Masaru, "Evaluations of organic and inorganic materials by means of displacement current measurement method," TOYOTech LLC, USA, Mar. 5, 2021, pp. 1-23.
Naemura, Shohei, "Measurement of a small amount of mobile ions in liquid crystals," Applied Physics, Oct. 10, 1996, vol. 65, No. 10, pp. 1065-1066, with its partial English translation of the section "2.1.2 Ion impurities" on p. 2 from "Review of various measurement methodologies of migration ion influence on LCD image quality and new measurement proposal beyond LCD materials.".
International Preliminary Report on Patentability Chapter II (IPRP2) issued on Oct. 25, 2022 in International (PCT) Application No. PCT/JP2021/035456, with its English translation.
Office Action issued Jun. 28, 2024 in corresponding Chinese patent application No. 202180102707.1, with partial English translation.

* cited by examiner

CHARGE AMOUNT MEASUREMENT METHOD AND CHARGE AMOUNT MEASUREMENT SYSTEM

TECHNICAL FIELD

The present disclosure relates to a charge amount measurement method and a charge amount measurement system that measure an amount of charge in a material to be measured.

BACKGROUND ART

Non Patent Literature (NPL) 1 discloses a method of measuring an amount of impurity ions included in a thermally activated delayed fluorescence (TADF) dopant powder by encapsulating a xylene solution including a green TADF dopant powder in a test cell and applying a triangular-wave voltage to the test cell to measure a current.

NPL 2 discloses a method of analyzing the physical properties of oligonucleotide deoxyribonucleic acid (DNA) by mixing an oligonucleotide DNA solution and a liquid crystal solution together and applying a triangular-wave voltage to a cell in which the mixed solution is encapsulated to measure a current.

CITATION LIST

Non Patent Literature

[NPL 1] Inoue M, Oyabu N, Kaneko Y, Kim J-Y, Yang J-H. Correlation between ion impurity in thermally activated delayed fluorescence organic light-emitting diode materials and device lifetime. J. Soc Inf Disp. 2020; 28 (11); 905-910.

[NPL 2] Kazuki Iwabata et al 2013 Jpn. J. Appl. Phys. 52 097301

SUMMARY OF THE INVENTION

Technical Problem

However, the techniques disclosed by the above-described NPLs 1 and 2 are both inadequate in terms of the accuracy of measuring an amount of charge in a material to be measured.

In view of the above, the present disclosure provides a charge amount measurement method and a charge amount measurement system that can improve the accuracy of measuring an amount of charge in a material to be measured.

Solution to the Problem

In order to address the above-described problems, the charge amount measurement method according to one aspect of the present disclosure includes: applying a periodically-changing voltage between a pair of electrodes arranged with a sample interposed therebetween in a cell in which the sample is encapsulated, the sample being created by mixing a material to be measured with a nonpolar liquid crystal whose liquid crystal molecules do not rotate due to an application of the periodically-changing voltage; and measuring an amount of charge in the material to be measured, based on a current that flows through the pair of the electrodes and the sample due to the application of the periodically-changing voltage.

Moreover, in order to address the above-described problems, the charge amount measurement method according to one aspect of the present disclosure includes: applying a periodically-changing voltage between a pair of electrodes arranged with a sample and vertical alignment films interposed therebetween in a cell in which the sample interposed between the vertical alignment films is encapsulated, the sample being created by mixing a material to be measured with a liquid crystal having positive dielectric anisotropy; and measuring an amount of charge in the material to be measured, based on a current that flows through the pair of the electrodes and the sample due to the application of the periodically-changing voltage.

In addition, in order to address the above-described problems, the charge amount measurement system according to one aspect of the present disclosure includes: a voltage applier that applies a periodically-changing voltage between a pair of electrodes arranged with a sample interposed therebetween in a cell in which the sample is encapsulated, the sample being created by mixing a material to be measured with a nonpolar liquid crystal whose liquid crystal molecules do not rotate due to an application of the periodically-changing voltage; and a measurer that measures an amount of charge in the material to be measured, based on a current that flows through the pair of electrodes and the sample due to the application of the periodically-changing voltage.

Advantageous Effects of the Invention

The charge amount measurement method and the charge amount measurement system according to the present disclosure have an advantageous effect of improving the accuracy of measuring an amount of charge in a material to be measured.

DETAILED DESCRIPTION

Figure 1:
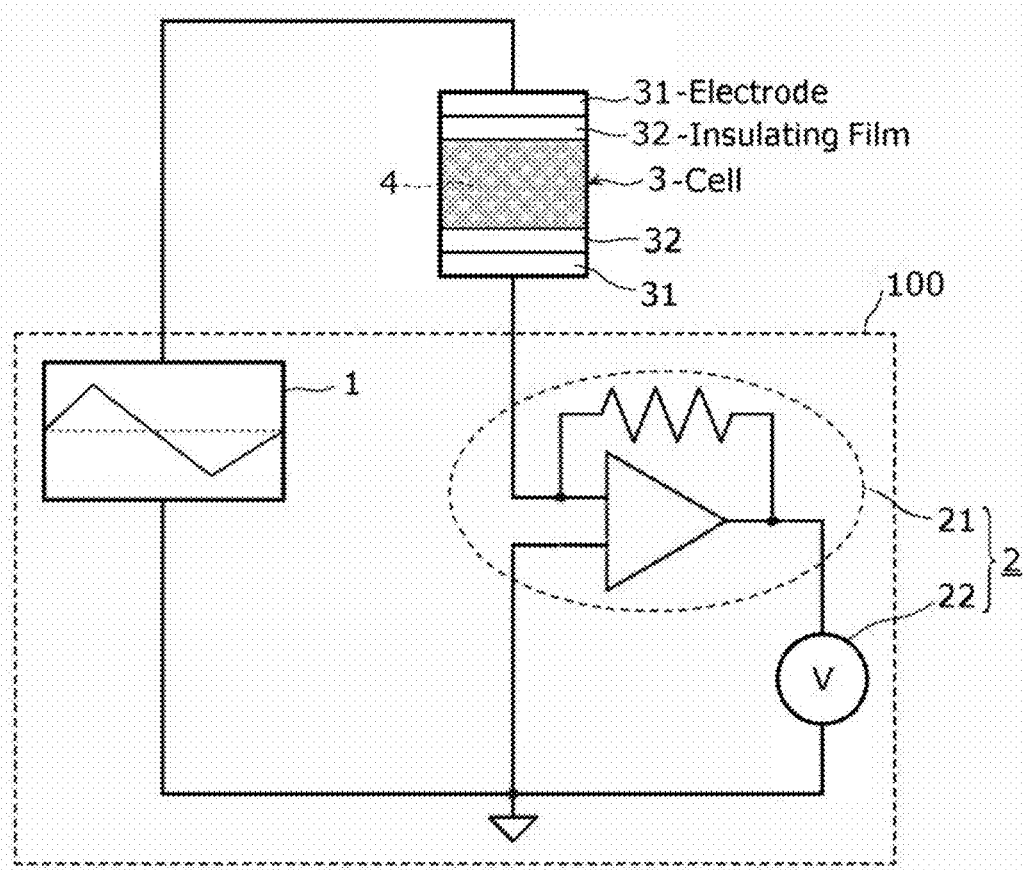
FIG. 1 is a schematic diagram illustrating a configuration of a charge amount measurement system according to an embodiment.

Hereinafter, embodiments will be described in detail with reference to the drawings.

Note that the embodiments below each describe a general or specific example. The numerical values, shapes, materials, elements, the arrangement and connection of the elements etc., described in the following embodiments are mere examples, and therefore are not intended to limit the scope of the claims. Furthermore, among the elements in the embodiments below, those not recited in any one of the independent claims representing the most generic concepts will be described as optional elements. Note that the drawings are schematic illustrations and are not necessarily precise depictions. Moreover, in the drawings, elements that are essentially the same share like reference signs. Accordingly, duplicate description is omitted or simplified.

Figure 2:
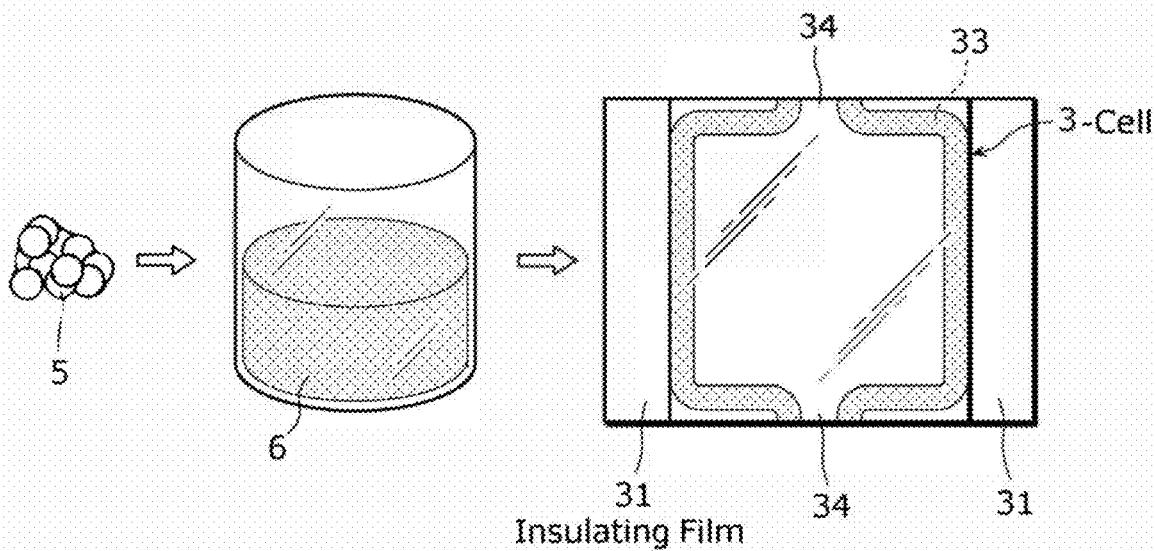
FIG. 2 is a schematic diagram illustrating the processes of creating a cell according to the embodiment.

FIG. 1 is a schematic diagram illustrating a configuration of charge amount measurement system 100 according to the embodiment. FIG. 2 is a schematic diagram illustrating the processes of creating cell 3 according to the embodiment. A charge amount measurement method and charge amount measurement system 100 according to the embodiment measure an amount of charge in material 5 to be measured. More specifically, the charge amount measurement method and charge amount measurement system 100 according to the embodiment measure an amount of charge in material 5 to be measured by applying a voltage to a pair of electrodes 31 included in cell 3 in which sample 4 that is created by mixing material 5 to be measured with nonpolar liquid crystal 6 is encapsulated.

Charge amount measurement system 100 includes, as illustrated in FIG. 1, voltage applier 1 and measurer 2.

Voltage applier 1 is connected between the pair of electrodes 31 (to be described later) included in cell 3, and applies a periodically-changing voltage between the pair of electrodes 31. In the present embodiment, voltage applier 1 is a function generator. Voltage applier 1 generates a triangular-wave voltage as a periodically-changing voltage, and applies the generated triangular-wave voltage between the pair of electrodes 31. A triangular-wave voltage has, as one example, a frequency of 0.01 Hz and an amplitude of ±10 V.

Note that both the frequency and amplitude of a triangular-wave voltage are mere examples, and therefore are not limited to the foregoing. However, a triangular-wave voltage is suitably a voltage having a relatively low frequency. This is because, when the frequency of a triangular-wave voltage increases, the polarity of the voltage is reversed before impurity ions 51 (see FIG. 11) included in material 5 to be measured reach insulating films 32 (to be described later), causing a current resulting from impurity ions 51 that move in a liquid crystal to be unmeasurable.

Measurer 2 measures material 5 to be measured, based on a current applied by voltage applier 1 which flows through the pair of electrodes 31 and sample 4. In the present embodiment, measurer 2 includes I-V converter 21 and voltmeter 22. I-V converter 21 is serially connected with the pair of electrodes 31 of cell 3, and converts a current flowing through the pair of electrodes 31 and sample 4 into a voltage. Voltmeter 22 measures the voltage converted by I-V converter 21. In other words, measurer 2 uses voltmeter 22 to measure the voltage converted by I-V converter 21 to measure the current flowing through the pair of electrodes 31 and sample 4.

Moreover, measurer 2 measures the current (displacement current) flowing through the pair of electrodes 31 and sample 4 to measure an amount of impurity ions 51 included in material 5 to be measured. The foregoing will be described in detail later.

Figure 3:
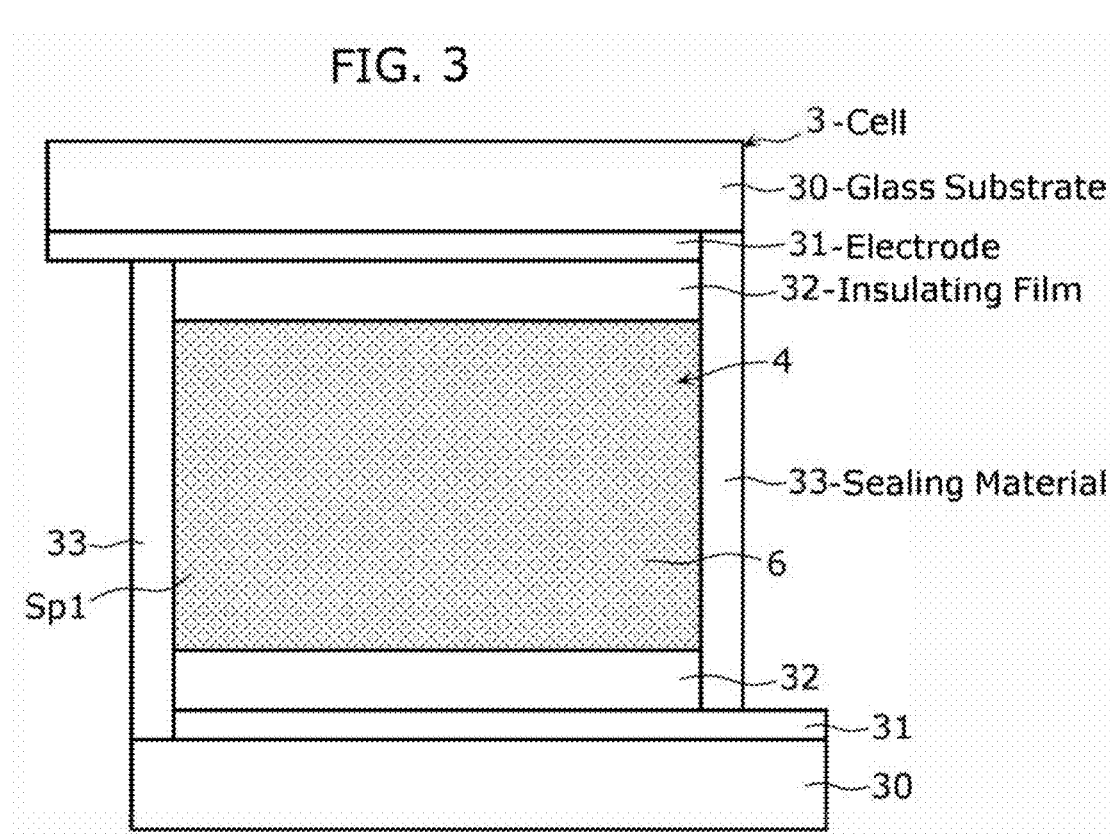
FIG. 3 is a schematic diagram illustrating the cell according to the embodiment.

FIG. 3 is a schematic diagram illustrating cell 3 according to the embodiment. Cell 3 includes, as illustrated in FIG. 3, a pair of glass substrates 30, the pair of electrodes 31, a pair of insulating films 32, and sealing materials 33. In the present embodiment, cell 3 is in the shape of a square of few centimeters square in plan view. Note that FIG. 3 illustrates a state in which sample 4 is encapsulated in cell 3.

The pair of electrodes 31 each are an indium tin oxide (ITO) electrode, and are a transparent electrode. Note that a material included in the pair of electrodes 31 is not particularly limited. For example, the pair of electrodes 31 each may be an aluminum (Al) electrode. One of the pair of electrodes 31 (here, the upper electrode 31) is formed on a surface (here, the lower surface) of one of the pair of glass substrates 30 (here, the upper glass substrate 30). The other of the pair of electrodes 31 (here, the lower electrode 31) is formed on a surface (here, the upper surface) of the other of the pair of glass substrates 30 (here, the lower glass substrate 30).

The pair of insulating films 32 each are a silicon nitride (SiN) insulating film. Note that a material included in the pair of insulating films 32 is not particularly limited. For example, the pair of insulating films 32 each may be a polyimide insulating film. One of the pair of insulating films 32 (here, the upper insulating film 32) is formed on a surface (here, the lower surface) of one of the pair of electrodes 31 (here, the upper electrode 31). The other of the pair of insulating films 32 (here, the lower insulating film 32) is formed on a surface (here, the upper surface) of the other of the pair of electrodes 31 (here, the lower electrode 31). The pair of insulating films 32 are arranged facing each other with space Sp1 in which sample 4 is to be encapsulated interposed therebetween. Accordingly, the pair of glass substrates 30 and the pair of electrodes 31 are also arranged likewise, facing each other with the above-mentioned space Sp1 interposed therebetween.

Sealing materials 33 are applied between (i) one of the pair of glass substrates 30, one of the pair of electrodes 31, and one of the pair of insulating films 32 and (ii) the other of the pair of glass substrates 30, the other of the pair of electrodes 31, and the other of the pair of insulating films 32 so as to cover the above-mentioned space Sp1. In other words, the above-mentioned space Sp1 is formed by the pair of glass substrates 30, the pair of electrodes 31, the pair of insulating films 32, and sealing materials 33. Note that the pair of electrodes 31 each have an externally exposed portion. Voltage applier 1 and measurer 2 are electrically connectable to respective exposed portions via an electric wire.

Material 5 to be measured is an organic material such as poly(3-hexylthiophene) (P3HT) that is used as a material for an organic solar cell or a material used for a hole transport layer (HTL) of organic electroluminescence (organic EL). In the present embodiment, material 5 to be measured is a material to be used for an HTL of organic EL. Note that material 5 to be measured may be, for example, an organic material such as DNA or may be an inorganic material. In the present embodiment, material 5 to be measured that is to be mixed with nonpolar liquid crystal 6 is in the form of granules, powder, or liquid. Note that liquid here includes, besides a solution in which material 5 to be measured is dissolved, a solvent that is material 5 to be measured.

Nonpolar liquid crystal 6 is a liquid crystal whose liquid crystal molecules do not rotate even if a voltage is applied. Nonpolar liquid crystal 6 is, stated differently, a neutral liquid crystal. Furthermore, nonpolar liquid crystal 6 is a liquid crystal with zero or almost zero dielectric anisotropy $\Delta\varepsilon$. Dielectric anisotropy $\Delta\varepsilon$ is expressed by a difference between a dielectric constant in the axial direction of liquid crystal molecules and a dielectric constant in the direction orthogonal to the axial direction of the liquid crystal molecules. In the present embodiment, nonpolar liquid crystal 6 is a fluorine-based nematic liquid crystal. Even more specifically, nonpolar liquid crystal 6 in the present embodiment is, for example, NA-1345 that is the model name of a product of DIC Corporation. Needless to say, nonpolar liquid crystal 6 is not particularly limited to the liquid crystal of the above-mentioned product.

Here, differences in properties between nonpolar liquid crystal 6 and a polar liquid crystal will be described with reference to FIG. 4 and FIG. 5. Here, a polar liquid crystal is a liquid crystal whose liquid crystal molecules rotate due to an application of a voltage. Stated differently, the polar liquid crystal is a liquid crystal having positive dielectric anisotropy $\Delta\varepsilon$ or a liquid crystal having negative dielectric anisotropy $\Delta\varepsilon$.

Figure 4:
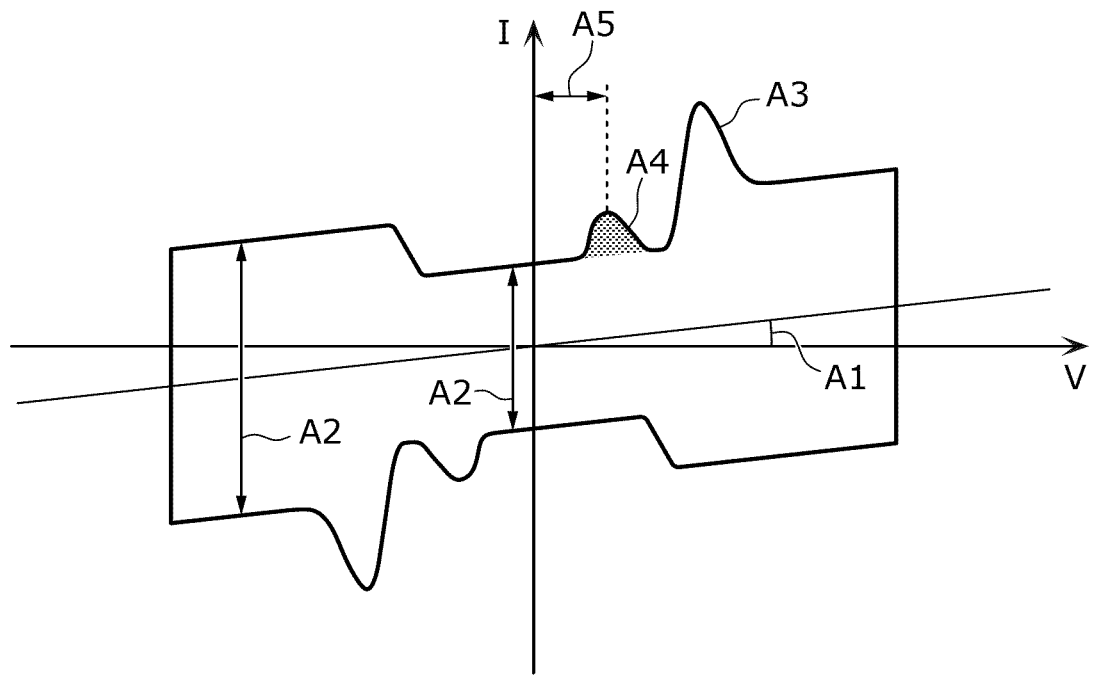
FIG. 4 is a diagram illustrating one example of a graph showing the plotted voltage (time) vs. current obtained by measuring a displacement current that flows when a triangular-wave voltage is applied to a cell in which a polar liquid crystal is encapsulated.

FIG. 4 is a diagram illustrating one example of a graph (V-I curve) showing the plotted voltage V (time) vs. current I that can be obtained by measuring a displacement current that flows when a triangular-wave voltage is applied to a cell in which a polar liquid crystal is encapsulated. FIG. 5 is a diagram illustrating one example of a graph (V-I curve) showing the plotted voltage V (time) vs. current I that can be obtained by measuring a displacement current that flows when a triangular-wave voltage is applied to a cell in which nonpolar liquid crystal 6 is encapsulated. Here, only the liquid crystal is encapsulated in each of the cells. Accordingly, material 5 to be measured is not mixed with the liquid crystals.

In FIG. 4, the inverse of inclination A1 relative to the V axis denotes a resistance value of the polar liquid crystal. Moreover, in FIG. 4, height A2 in the I-axis direction of the parallelogram-shaped graph denotes capacitance of the polar liquid crystal. In addition, in FIG. 4, peak A3 in the I-axis direction of the parallelogram-shaped graph denotes a switching voltage (stated differently, a switching current) of the polar liquid crystal. Furthermore, in FIG. 4, the area size of protruding portion A4 that protrudes from the parallelogram-shaped graph denotes the density of impurity ions 51 included in the polar liquid crystal. Lastly, in FIG. 4, width A5 in the V-axis direction of the parallelogram-shaped graph denotes the mobility of impurity ions 51 included in the polar liquid crystal. Peak A3, protruding portion A4, and width A5 appear not only in the first quadrant, but also in the third quadrant.

As illustrated in FIG. 4, when a polar liquid crystal is used for a cell as a solvent, the following appear in the measurement result obtained by measuring a displacement current: (i) switching currents (peaks A3) of the polar liquid crystal and (ii) physical properties (protruding portions A4 and widths A5) of impurity ions 51 included in the polar liquid crystal. For this reason, when a sample created by mixing material 5 to be measured with a polar liquid crystal is encapsulated in a cell, not only the physical properties of material 5 to be measured appear in the measurement result obtained by measuring a displacement current, but also the physical properties of the cell appear in the measurement result.

Figure 5:
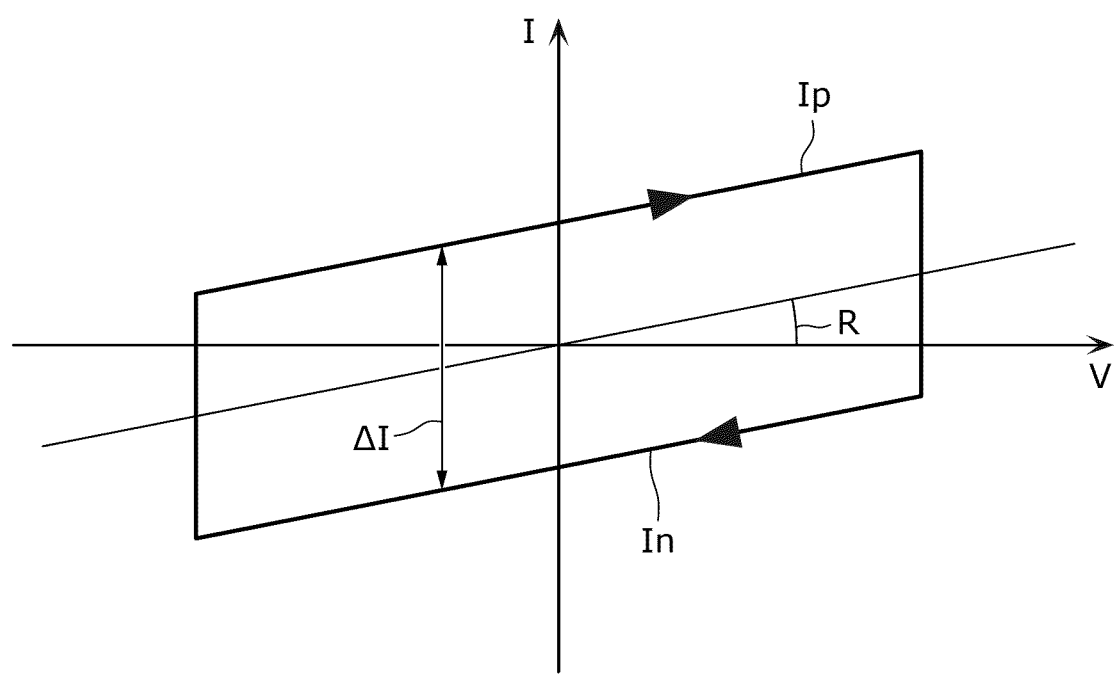
FIG. 5 is a diagram illustrating one example of a graph showing the plotted voltage (time) vs. current obtained by measuring a displacement current that flows when a triangular-wave voltage is applied to a cell in which a nonpolar liquid crystal is encapsulated.

In FIG. 5, the inverse of the inclination relative to the V axis denotes resistance value R of nonpolar liquid crystal 6. Moreover, in FIG. 5, the upper side of the parallelogram-shaped graph denotes current Ip that flows through a cell when a voltage to be applied to the cell is increased. Alternatively, the lower side of the parallelogram-shaped graph denotes current In that flows through the cell when the voltage to be applied to the cell is decreased. In addition, in FIG. 5, the height in the I-axis direction of the parallelogram-shaped graph is difference $\Delta I$ between the above-described current Ip and the above-described current In, and denotes the capacitance of nonpolar liquid crystal 6.

As illustrated in FIG. 5, when nonpolar liquid crystal 6 is used for the cell as a solvent, a switching current that appeared when the polar liquid crystal was used for the cell as a solvent does not appear in the measuring result obtained by measuring a displacement current, since liquid crystal molecules do not rotate due to an application of a voltage. Moreover, since nonpolar liquid crystal 6 has high purity as compared with the polar liquid crystal, nonpolar liquid crystal 6 hardly includes impurity ions 51. In this case, the physical properties of impurity ions 51 do not appear in the measuring result, or are insignificant even if they appear in the measuring result. For this reason, when a sample created by mixing material 5 to be measured with nonpolar liquid crystal 6 is encapsulated in a cell, only the physical properties of material 5 to be measured appear in the measurement result obtained by measuring a displacement current.

Hereinafter, a method of creating cell 3 will be described with reference to FIG. 2 and FIG. 3. First, material 5 to be measured and nonpolar liquid crystal 6 are prepared, and material 5 to be measured is mixed with nonpolar liquid crystal 6 to create sample 4. Next, cell 3 with empty space Sp1 is prepared, and the created sample 4 is encapsulated in cell 3. Here, two injection openings 34 are formed in an area to which sealing materials 33 are applied in cell 3. The created sample 4 is encapsulated in cell 3 through at least one of these two injection openings 34 using capillary action. Through these above-described processes, cell 3 in which sample 4 is encapsulated can be created.

<Method>

Figure 6:
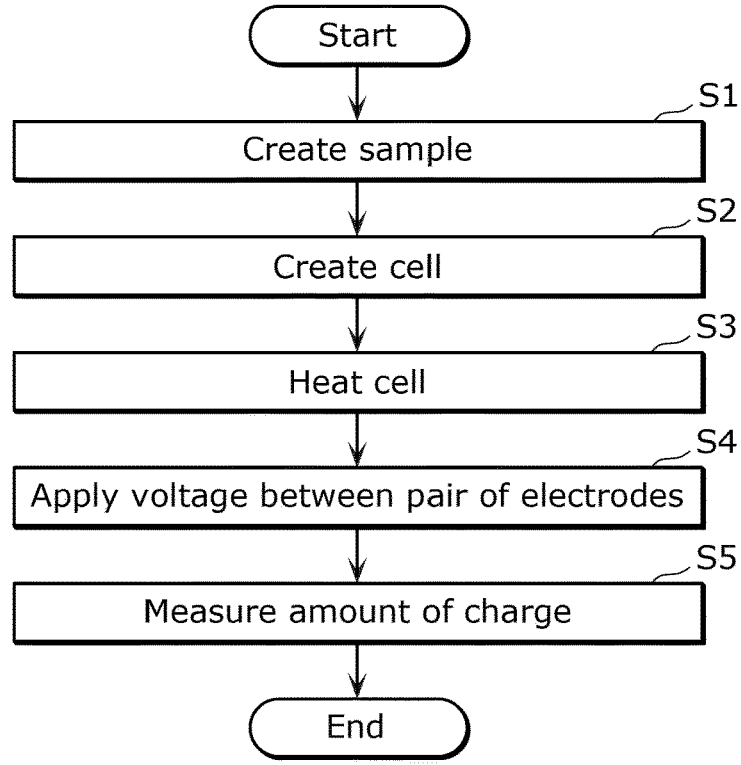
FIG. 6 is a flowchart illustrating one example of a charge amount measurement method according to the embodiment.

Hereinafter, operations performed by charge amount measurement system 100, in other words, a charge amount measurement method, according to the embodiment will be described with reference to FIG. 6. FIG. 6 is a flowchart illustrating one example of the charge amount measurement method according to the embodiment. FIG. 6 also includes a process of creating the above-described cell 3.

First, material 5 to be measured is mixed with nonpolar liquid crystal 6 to create sample 4 (step S1). Next, the created sample 4 is encapsulated in cell 3 with empty space Sp1 to create cell 3 in which sample 4 is encapsulated (step S2).

Next, cell 3 is heated (step S3). Here, cell 3 is heated until the ambient temperature of cell 3 reaches 60 degrees Celsius. Then, while cell 3 is heated or while cell 3 is placed in a high-temperature environment, a voltage (here, a triangular-wave voltage) is applied between a pair of electrodes 31 of cell 3 by voltage applier 1 (step S4). In other words, in the present embodiment, step S4 in which a voltage is applied between the pair of electrodes 31 is performed under a temperature higher than a normal temperature (here, about 60 degrees Celsius).

By heating cell 3 as described above, the viscosity of nonpolar liquid crystal 6 can be reduced. Accordingly, it is possible to improve the mobility of charge of material 5 to be measured within nonpolar liquid crystal 6 or the mobility of impurity ions 51 included in material 5 to be measured. More specifically, the mobility of ions can be expressed by the equation below. In the equation below, "$\mu$" denotes the mobility of ions, "$Z$" denotes the valence of the ions, "$e$" denotes the elementary charge, "$\eta$" denotes the viscosity of a liquid crystal, and "$\gamma_s$" denotes the stokes radius of the ions.

$$\mu = \frac{Ze}{6\pi\eta\gamma_s} \quad \text{[Math. 1]}$$

As expressed by the above equation, "$\eta$" denoting the viscosity of a liquid crystal reduces with an increase in the mobility of ions, in other words, the mobility of impurity ions 51. With this, in step S5 in which an amount of charge in material 5 to be measured is measured, it is possible to improve the accuracy of measuring the charge of material 5 to be measured or an amount of charge of impurity ions 51 included in material 5 to be measured, as compared with the case where cell 3 is not heated.

Next, measurer 2 measures a current (displacement current) flowing through the pair of electrodes 31 of cell 3 and sample 4 to measure the amount of charge in material 5 to be measured based on the measured current (step S5).

Figure 7:
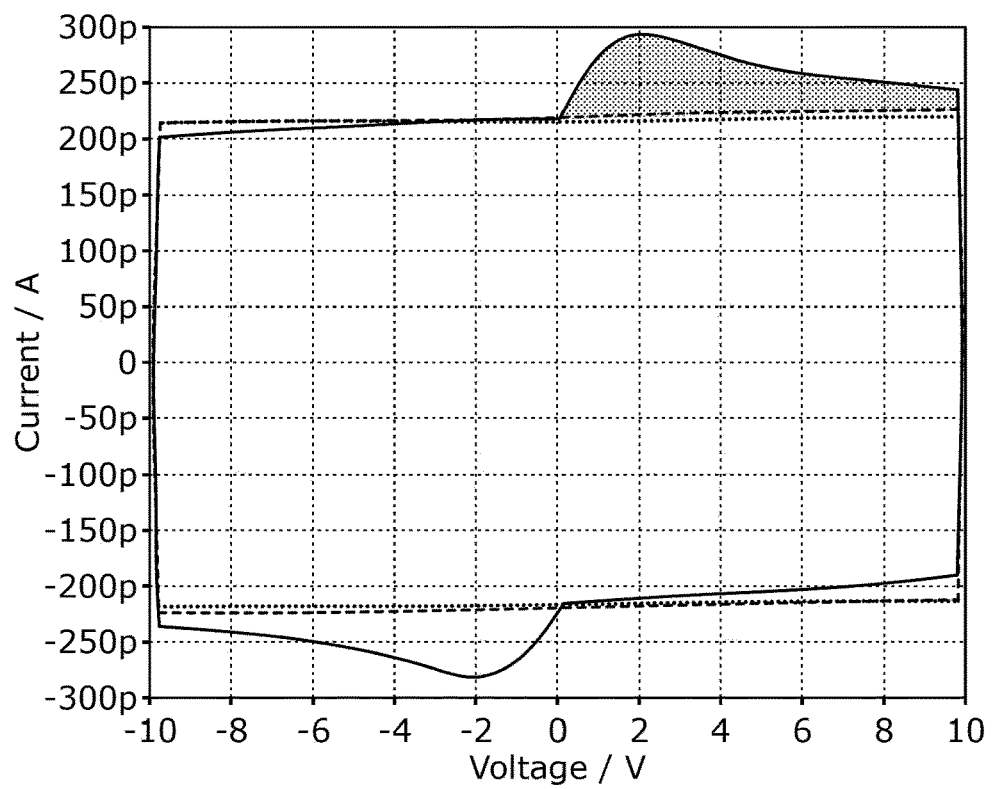
FIG. 7 is a diagram illustrating one example of a measurement result obtained using the charge amount measurement method according to the embodiment.
Figure 8:
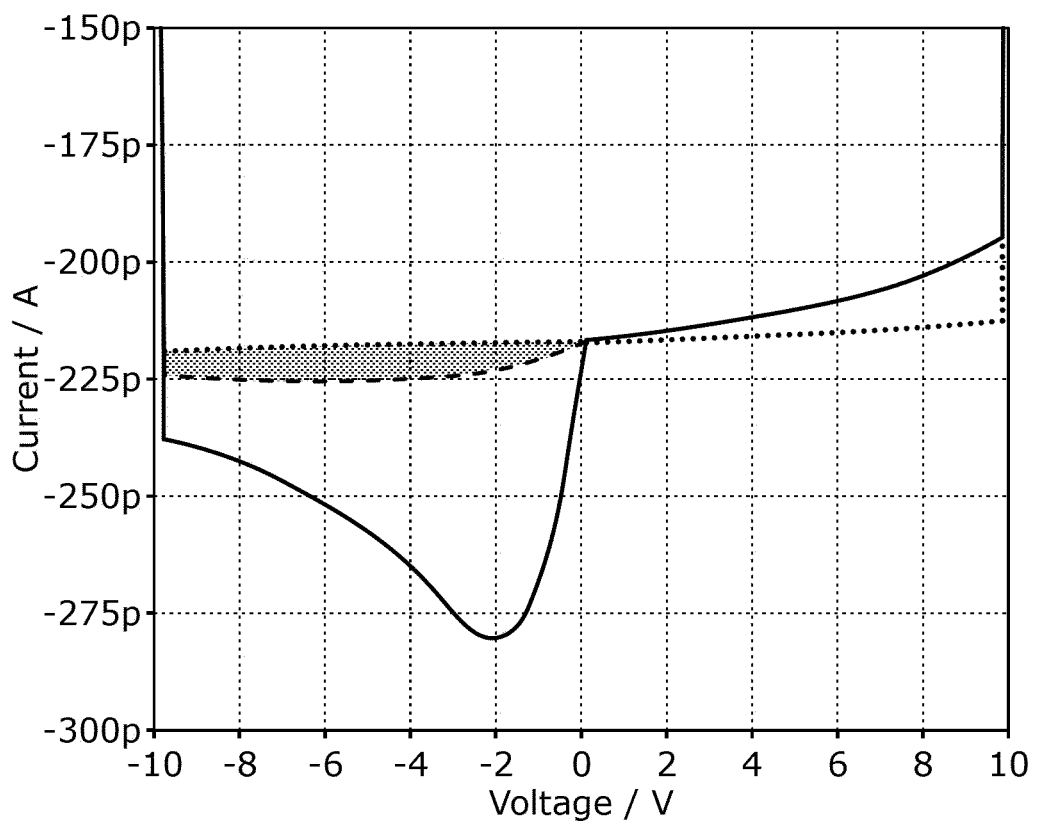
FIG. 8 is a diagram illustrating a partially enlarged example of the measurement result shown in FIG. 7.

Here, a specific example of measuring an amount of charge in material 5 to be measured will be described with reference to FIG. 7 and FIG. 8. FIG. 7 is a diagram illustrating one example of a measurement result obtained using the charge amount measurement method according to the embodiment. FIG. 8 is a diagram illustrating a partially enlarged example of the measurement result shown in FIG. 7. In the measurement result shown in each of FIG. 7 and FIG. 8, the vertical axis represents the current (the unit is in "pA") that flows through the pair of electrodes 31 and sample 4, and the horizontal axis represents the voltage (the unit is in "V") applied between the pair of electrodes 31.

In each of FIG. 8 and FIG. 7, the solid line denotes the measurement result obtained by measuring cell 3 in which sample 4 created by mixing material 5 to be measured with nonpolar liquid crystal 6 is encapsulated. Moreover, in each of FIG. 7 and FIG. 8, the dotted line denotes the measurement result obtained by measuring cell 3 in which only nonpolar liquid crystal 6 is encapsulated. In addition, in each of FIG. 7 and FIG. 8, the dashed line denotes the measurement result obtained by measuring cell 3 in which a sample created by mixing nonpolar liquid crystal 6 with material 5 to be measured from which impurities are removed by sublimation refining is encapsulated. In any of these samples, the concentration of material 5 to be measured is 1 wt %.

As shown by the dotted line in each of FIG. 7 and FIG. 8, no peak protruding from the parallelogram-shaped graph is generated in the measurement result obtained by measuring cell 3 in which only nonpolar liquid crystal 6 is encapsulated. Alternatively, as shown by the solid line in each of FIG. 7 and FIG. 8, a peak is generated in the parallelogram-shaped graph when impurities are included (impurity ions 51 are included) in material 5 to be measured. In other words, by calculating an area size of an area including the peak (the dot-hatched area surrounded by dots in FIG. 7), it is possible to measure an amount of charge of impurity ions 51 included in material 5 to be measured, or stated differently, an amount of impurity ions 51.

Furthermore, as shown by the dashed line in FIG. 8, a peak protruding from the parallelogram-shaped graph is also generated in the measurement result obtained in the case where sublimation refining was performed on material 5 to be measured. Accordingly, by calculating an area size of an area including the peak (the dot-hatched area in FIG. 8), it is possible to measure an amount of charge of impurity ions 51 slightly remained in material 5 to be measured, or stated differently, an amount of impurity ions 51, even if impurities are removed from material 5 to be measured by sublimation refining.

Advantageous Effects

Hereinafter, advantageous effects produced by the charge amount measurement method and charge amount measurement system 100 according to the embodiment will be described. First, a technical background that has led to the measurement of an amount of charge in material 5 to be measured like the charge amount measurement method and charge amount measurement system 100 according to the embodiment will be described.

For example, when an organic material or an inorganic material includes impurity ions 51, these impurity ions 51 may adversely affect the properties of a device (e.g., a solar battery) that uses the organic material or inorganic material. For this reason, when a device is created, it is important to measure whether an organic material or an inorganic material to be used for creating the device includes impurity ions 51.

Here, as a method of analyzing material 5 to be measured, a scientific method of analysis, such as high performance liquid chromatography (HPLC), has been known. However, it is difficult to detect whether material 5 to be measured includes impurity ions 51 using HPLC.

In contrast to the above, a method of detecting whether material 5 to be measured includes impurity ions 51 using an electroanalytical method of measuring an amount of charge in material 5 to be measured has been known, and NPL 1 and NPL 2 disclosed this method.

NPL 1 discloses, as described in the Background Art section, a method of measuring an amount of impurity ions included in a TADF dopant powder by encapsulating a xylene solution including a green TADF dopant powder in a test cell and applying a triangular-wave voltage to the test cell to measure a current. However, in the technique disclosed by NPL 1, impurity ions included in the xylene solution may affect the measurement. Hereinafter, the problem presented above will be described in detail.

Figure 9:
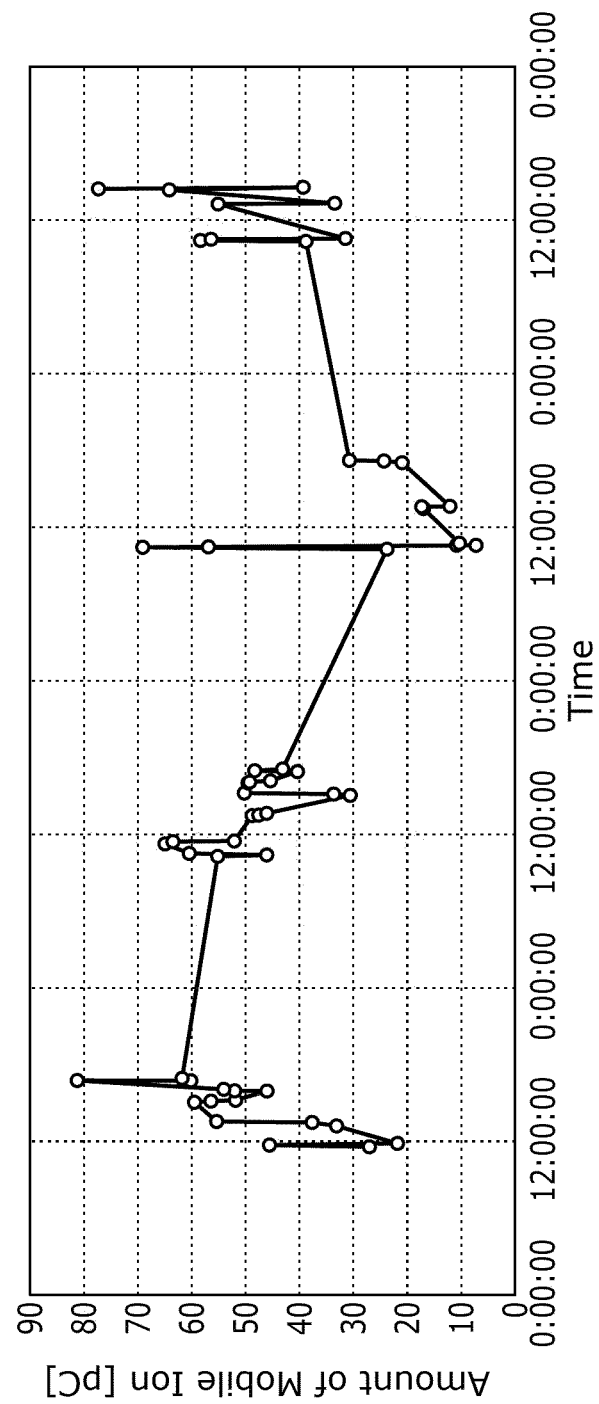
FIG. 9 is a diagram illustrating one example of a measurement result obtained by measuring an amount of impurity ions included in xylene.

FIG. 9 is a diagram illustrating one example of a measurement result obtained by measuring an amount of impurity ions included in xylene. In FIG. 9, the vertical axis represents the amount of impurity ions and the horizontal axis represents time. Here, the amount of impurity ions is indicated by the total amount of charge of impurity ions. As illustrated in FIG. 9, the amount of impurity ions included in the xylene varies with the passage of time, and the amount of impurity ions is relatively large, ranging from several pC to several tens of pC.

Although an amount of charge in material 5 to be measured is intended to be measured using the technique disclosed by NPL 1, the measurement result includes an amount of impurity ions included in the xylene. For this reason, it is difficult to accurately measure an amount of charge in material 5 to be measured. Moreover, since the amount of impurity ions included in the xylene varies with the passage of time, it is difficult to apply a method of measuring the amount of impurity ions included only in the xylene in advance for the calculation of the difference between the measurement result obtained by measuring the amount of charge in material 5 to be measured and the amount of impurity ions included only in the xylene.

In order to address the above problem, the inventors of the present application have found that, when material 5 to be measured is mixed with nonpolar liquid crystal 6, only an amount of charge of impurity ions 51 included in material 5 to be measured can be measured, or in other words, whether material 5 to be measured includes impurity ions 51 or not can be accurately detected, since nonpolar liquid crystal 6 is a liquid crystal of high purity and a measurement result includes no switching current.

Figure 10:
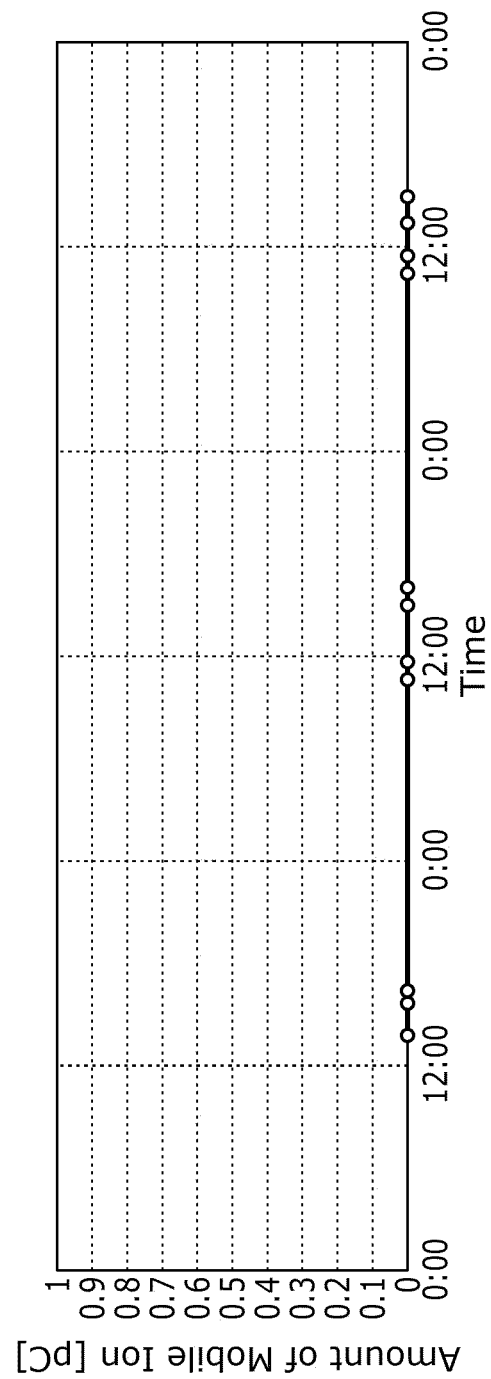
FIG. 10 is a diagram illustrating one example of a measurement result obtained by measuring an amount of impurity ions included in a nonpolar liquid crystal.

FIG. 10 is a diagram illustrating one example of a measurement result obtained by measuring an amount of impurity ions included in nonpolar liquid crystal 6. This measurement result is a result of a measurement performed under a temperature higher than a normal temperature (here, about 60 degrees Celsius). In FIG. 10, the vertical axis represents the amount of impurity ions and the horizontal axis represents time. Here, the amount of impurity ions is indicated by the total amount of charge of impurity ions. As illustrated in FIG. 10, impurity ions are not present in a nonpolar liquid crystal to a degree close to zero. Moreover, even if a very small amount of impurity ions is present, the amount of impurity ions hardly changes with the passage of time. In other words, nonpolar liquid crystal 6 has purity in which a variation in an amount of charge in nonpolar liquid crystal 6 (here, an amount of impurity ions included in nonpolar liquid crystal 6) with the passage of time is less than or equal to 0.1 pC.

Accordingly, the charge amount measurement method and charge amount measurement according to the embodiment can accurately measure an amount of charge in material 5 to be measured (here, an amount of impurity ions 51 included in material 5 to be measured), as compared with the case where xylene is used as a solvent with which material 5 to be measured is to be mixed. More specifically, the charge amount measurement method and charge amount measurement system 100 according to the embodiment can measure a very small amount (e.g., several pC) of impurity ions 51 included in material 5 to be measured.

NPL 2 discloses, as described in the Background Art section, a method of analyzing the physical properties of oligonucleotide DNA by mixing an oligonucleotide DNA solution and a liquid crystal solution together and applying a triangular-wave voltage to a cell in which the mixed solution is encapsulated to measure a current. Even more specifically, in NPL 2, the sample is created by mixing oligonucleotide DNA with a liquid crystal having negative dielectric anisotropy $\Delta\varepsilon$, and this sample is encapsulated in a cell including a horizontal alignment film. In other words, in NPL2, the rotation of liquid crystal molecules due to an application of a voltage is controlled by the horizontal alignment film to inhibit a switching current.

The technique disclosed by NPL 2 can measure an amount of charge of the oligonucleotide DNA. However, due to a liquid crystal having a relatively low purity, a measurement value of the amount of charge is on the order of several hundred pC. Accordingly, it is difficult to implement measurement accuracy for the order of several pC. Therefore, it is difficult to accurately detect whether material 5 to be measured includes impurity ions 51 using the technique disclosed by NPL 2. In contrast to the above, the charge amount measurement method and charge amount measurement system 100 according to the embodiment can accurately detect whether material 5 to be measured includes impurity ions 51, as has been already described.

Moreover, in NPL 2, it is difficult to measure an amount of charge of the oligonucleotide DNA unless the oligonucleotide DNA is amplified during the preparation stage of the measurement. However, the charge amount measurement method and charge amount measurement system 100 according to the present disclosure can measure an amount of charge of DNA without amplifying the DNA during the preparation stage of the measurement even if material 5 to be measured is DNA.

As described above, the charge amount measurement method and charge amount measurement system 100 according to the embodiment has an advantageous effect of improving the accuracy of measuring an amount of charge in material 5 to be measured, as compared with the techniques disclosed by NPL 1 and NPL 2.

Variations

Hereinbefore, the charge amount measurement method and charge amount measurement system according to the present disclosure have been described based on the embodiments, but the present disclosure is not limited by these embodiments. The scope of the present disclosure may encompass embodiments as a result of making, to the embodiments, various modifications that may be conceived by those skilled in the art, and different embodiments achieved by combining some elements in the embodiments, as long as the resultant embodiments do not depart from the scope of the present disclosure.

In the above-described embodiment, step S4 in which a voltage is applied between the pair of electrodes 31 of cell 3 is performed under a temperature higher than a normal temperature; however, step S4 is not limited to the foregoing. For example, the above step S4 may be performed under a normal temperature.

In the above-described embodiment, sample 4 created by mixing material 5 to be measured with nonpolar liquid crystal 6 is encapsulated in cell 3; however, cell 3 is not limited to the foregoing. Hereinafter, cells according to Variation 1 and Variation 2 will be described with reference to FIG. 11 and FIG. 12, respectively.

Figure 11:
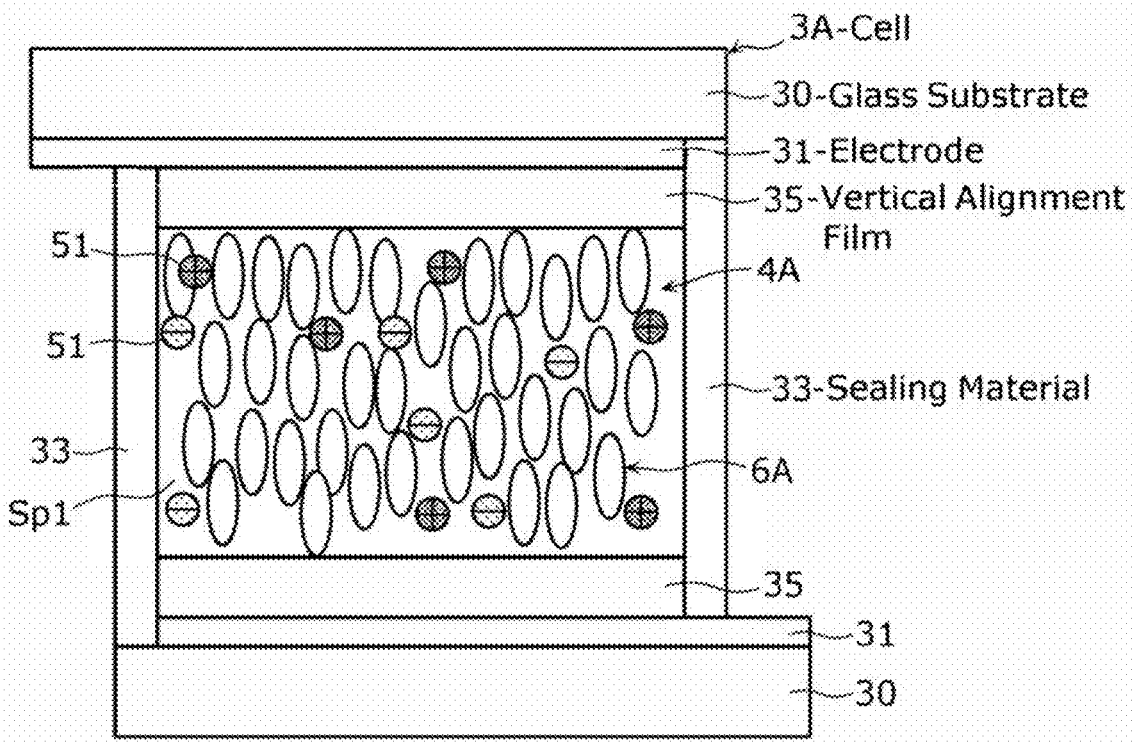
FIG. 11 is a schematic diagram illustrating a cell according to Variation 1 of the embodiment.

FIG. 11 is a schematic diagram illustrating cell 3A according to Variation 1 of the embodiment. As illustrated in FIG. 11, sample 4A created by mixing material 5 to be measured with liquid crystal 6A having positive dielectric anisotropy $\Delta\varepsilon$ is encapsulated in cell 3A. In addition, cell 3A includes a pair of vertical alignment films 35 instead of a pair of insulating films 32. For this reason, in cell 3A, the rotation of liquid crystal molecules in liquid crystal 6A due to an application of a voltage is controlled by the pair of vertical alignment films 35 to inhibit a switching current.

If the purity of liquid crystal 6A can be caused to approach the purity of nonpolar liquid crystal 6, Variation 1 can improve the accuracy of measuring an amount of charge in material 5 to be measured just like the case where nonpolar liquid crystal 6 is used.

Figure 12:
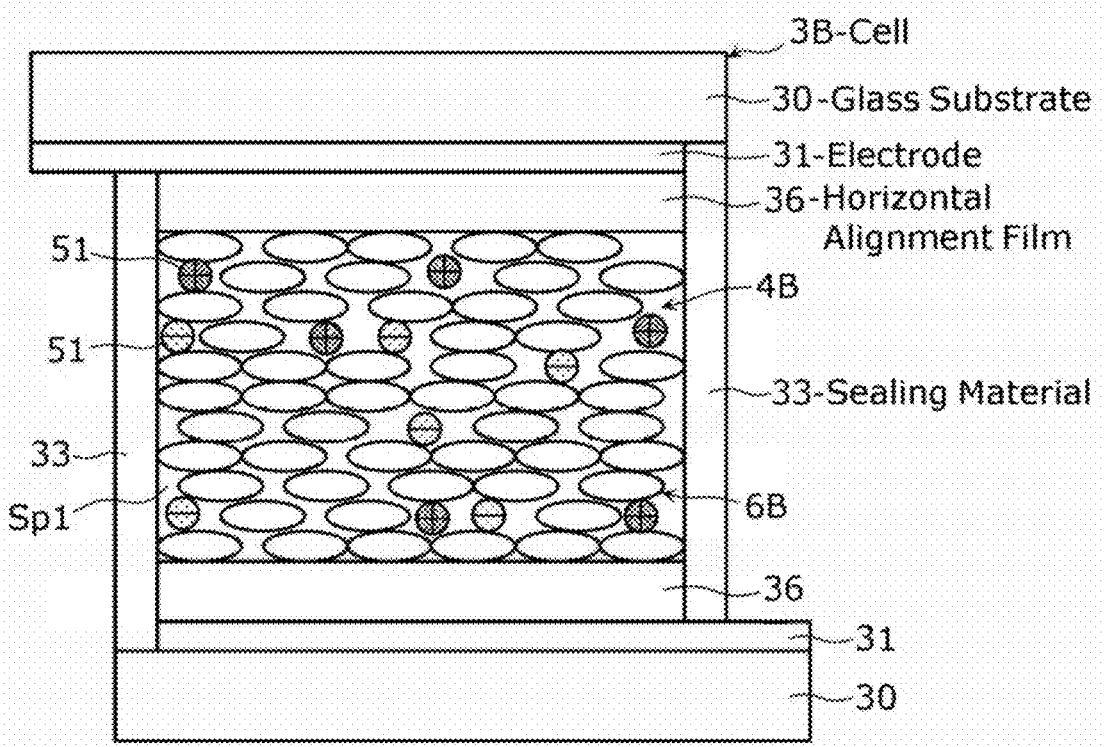
FIG. 12 is a schematic diagram illustrating a cell according to Variation 2 of the embodiment.

FIG. 12 is a schematic diagram illustrating cell 3B according to Variation 2 of the embodiment. As illustrated in FIG. 12, sample 4B created by mixing material 5 to be measured with liquid crystal 6B having negative dielectric anisotropy $\Delta\varepsilon$ is encapsulated in cell 3B. In addition, cell 3B includes a pair of horizontal alignment films 36 instead of a pair of insulating films 32. For this reason, in cell 3B, the rotation of liquid crystal molecules in liquid crystal 6B due to an application of a voltage is controlled by the pair of horizontal alignment films 36 to inhibit a switching current.

Like Variation 1, if the purity of liquid crystal 6B can be caused to approach the purity of nonpolar liquid crystal 6, Variation 2 can improve the accuracy of measuring an amount of charge in material 5 to be measured just like the case where nonpolar liquid crystal 6 is used.

In the above-described embodiment, the charge amount measurement method and charge amount measurement system 100 measure an amount of impurity ions 51 included in material 5 to be measured; however, the charge amount measurement method and charge amount measurement system 100 are not limited to the foregoing. As has been already described, when material 5 to be measured is, for example, DNA, the charge amount measurement method and charge amount measurement system 100 measure an amount of charge of the DNA. In other words, the charge amount measurement method and charge amount measurement system 100 may be used for measuring an amount of charge of material 5 to be measured or an amount of charge of impurities included in material 5 to be measured.

CONCLUSION

As has been described above, the charge amount measurement method according to the present disclosure includes applying a periodically-changing voltage between the pair of electrodes 31 arranged with sample 4 interposed therebetween in cell 3 in which sample 4 is encapsulated (step S4). Sample 4 is created by mixing material 5 to be measured with nonpolar liquid crystal 6 whose liquid crystal molecules do not rotate due to an application of the periodically-changing voltage. The charge amount measurement method according to the present disclosure also includes measuring an amount of charge in material 5 to be measured, based on a current that flows through the pair of electrodes 31 and sample 4 due to the application of the periodically-changing voltage (step S5).

According to the above, it is possible to measure an amount of charge deriving from only material 5 to be measured, since displacement currents deriving from nonpolar liquid crystal 6 are hardly present. In other words, the above produces an advantageous effect of improving the accuracy of measuring an amount of charge in material 5 to be measured, as compared with the case where a solvent other than nonpolar liquid crystal 6 is used.

Moreover, in the charge amount measurement method according to the present disclosure, nonpolar liquid crystal 6 has purity in which a variation in the amount of charge in nonpolar liquid crystal 6 with the passage of time is less than or equal to 0.1 pC.

According to the above, it is possible to accurately measure an amount of charge deriving from only material 5 to be measured. Therefore, the above produces an advantageous effect of further improving the accuracy of measuring an amount of charge in material 5 to be measured.

In addition, the charge amount measurement method according to the present disclosure includes applying a periodically-changing voltage between the pair of electrodes 31 arranged with sample 4A and vertical alignment films 35 interposed therebetween in cell 3A in which sample 4A interposed between vertical alignment films 35 is encapsulated. Sample 4A is created by mixing material 5 to be measured with liquid crystal 6A having positive dielectric anisotropy (step S4). The charge amount measurement method according to the present disclosure also includes measuring an amount of charge in material 5 to be measured, based on a current that flows through the pair of electrodes 31 and sample 4A due to the application of the periodically-changing voltage (step S5).

According to the above, it is possible to measure an amount of charge deriving from only material 5 to be measured, since displacement currents deriving from liquid crystal 6A are hardly present. In other words, the above produces an advantageous effect of improving the accuracy of measuring an amount of charge in material 5 to be measured, as compared with the case where a solvent other than nonpolar liquid crystal 6 and liquid crystal 6A is used.

Furthermore, in the charge amount measurement method according to the present disclosure, step S4 of applying the periodically-changing voltage between the pair of electrodes 31 is performed under a temperature higher than a normal temperature (step S3).

According to the above, it is possible to improve the mobility of the charge of material 5 to be measured present in a liquid crystal or the mobility of impurity ions 51 included in material 5 to be measured, since the viscosity of the liquid crystal that is a solvent of sample 4 can be reduced. As a result, the above produces an advantageous effect of further improving the accuracy of measuring an amount of charge in material 5 to be measured.

Moreover, in the charge amount measurement method according to the present disclosure, step S5 of measuring the amount of charge in material 5 to be measured is measuring of an amount of impurity ions 51 included in material 5 to be measured.

According to the above, it is possible to measure an amount of charge deriving from only impurity ions 51 included in material 5 to be measured, since displacement currents deriving from liquid crystal 6A are hardly present. In other words, the above produces an advantageous effect of improving the accuracy of measuring an amount of impurity ions 51 included in material 5 to be measured, as compared with the case where a solvent other than nonpolar liquid crystal 6 and liquid crystal 6A is used.

In addition, charge amount measurement system 100 according to the present disclosure includes voltage applier 1 and measurer 2. Voltage applier 1 applies a periodically-changing voltage between the pair of electrodes 31 arranged with sample 4 interposed therebetween in cell 3 in which sample 4 is encapsulated. Sample 4 is created by mixing material 5 to be measured with nonpolar liquid crystal 6 whose liquid crystal molecules do not rotate due to an application of the periodically-changing voltage. Measurer 2 measures an amount of charge in material 5 to be measured, based on a current that flows through the pair of electrodes 31 and sample 4 due to the application of the periodically-changing voltage.

According to the above, it is possible to measure an amount of charge deriving from only material 5 to be measured, since displacement currents deriving from nonpolar liquid crystal 6 are hardly present. In other words, the above produces an advantageous effect of improving the accuracy of measuring an amount of charge in material 5 to be measured, as compared with the case where a solvent other than nonpolar liquid crystal 6 is used.

INDUSTRIAL APPLICABILITY

The present disclosure is applicable to a method and a system that measure an amount of charge in, for example, a material to be measured.

The invention claimed is:

1. A charge amount measurement method comprising:
   applying a periodically-changing voltage between a pair of electrodes arranged with a sample interposed therebetween in a cell in which the sample is encapsulated, the sample being created by mixing a material to be measured with a nonpolar liquid crystal whose liquid crystal molecules do not rotate due to an application of the periodically-changing voltage; and
   measuring an amount of charge in the material to be measured, based on a current that flows through the pair of the electrodes and the sample due to the application of the periodically-changing voltage.

2. The charge amount measurement method according to claim 1, wherein
   the nonpolar liquid crystal has purity in which a variation in the amount of charge in the nonpolar liquid crystal with a passage of time is less than or equal to 0.1 picocoulombs (pC).

3. A charge amount measurement method comprising:
   applying a periodically-changing voltage between a pair of electrodes arranged with a sample and vertical alignment films interposed therebetween in a cell in which the sample interposed between the vertical alignment films is encapsulated, the sample being created by mixing a material to be measured with a liquid crystal having positive dielectric anisotropy; and
   measuring an amount of charge in the material to be measured, based on a current that flows through the pair of the electrodes and the sample due to an application of the periodically-changing voltage.

4. The charge amount measurement method according to claim 1, wherein
   the applying of the periodically-changing voltage between the pair of electrodes is performed under a temperature higher than a normal temperature.

5. The charge amount measurement method according to claim 1, wherein
   the measuring of the amount of charge in the material to be measured is measuring of an amount of impurity ions included in the material to be measured.

6. A charge amount measurement system comprising:
   a voltage applier that applies a periodically-changing voltage between a pair of electrodes arranged with a sample interposed therebetween in a cell in which the sample is encapsulated, the sample being created by mixing a material to be measured with a nonpolar liquid crystal whose liquid crystal molecules do not rotate due to an application of the periodically-changing voltage; and
   a measurer that measures an amount of charge in the material to be measured, based on a current that flows through the pair of electrodes and the sample due to the application of the periodically-changing voltage.

* * * * *